(12) United States Patent
Lee et al.

(10) Patent No.: US 10,134,694 B2
(45) Date of Patent: Nov. 20, 2018

(54) METHOD OF FORMING REDISTRIBUTION LAYER

(71) Applicant: Taiwan Semiconductor Manufacturing CO., LTD., Hsinchu (TW)

(72) Inventors: Chih-Fei Lee, Tainan (TW); Fu-Cheng Chang, Tainan (TW); Chi-Cherng Jeng, Tainan (TW); Hsin-Chi Chen, Tainan (TW); Yuan-Ko Hwang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/160,618

(22) Filed: May 20, 2016

(65) Prior Publication Data

US 2016/0268221 A1 Sep. 15, 2016

Related U.S. Application Data

(62) Division of application No. 14/179,688, filed on Feb. 13, 2014, now Pat. No. 9,373,594.

(51) Int. Cl.
*H01L 21/48* (2006.01)
*H01L 23/00* (2006.01)
(Continued)

(52) U.S. Cl.
CPC .......... *H01L 24/02* (2013.01); *H01L 23/3192* (2013.01); *H01L 24/03* (2013.01); *H01L 24/05* (2013.01); *H01L 24/06* (2013.01); *H01L 23/525* (2013.01); *H01L 2224/0235* (2013.01); *H01L 2224/0236* (2013.01);
(Continued)

(58) Field of Classification Search
CPC ............. H01L 21/02063; H01L 21/486; H01L 21/76804; H01L 21/76805; H01L 21/76816; H01L 21/76879
See application file for complete search history.

(56) References Cited

U.S. PATENT DOCUMENTS

2005/0020047 A1 1/2005 Mis et al.
2005/0072998 A1 4/2005 Miura et al.
(Continued)

FOREIGN PATENT DOCUMENTS

CN 102217061 A 10/2011
CN 102403290 A 4/2012
(Continued)

OTHER PUBLICATIONS

Final Office Action in U.S. Appl. No. 14/179,688, dated Nov. 13, 2015, 14 pgs.
Non-Final Office Action in U.S. Appl. No. 14/179,688, dated Jul. 31, 2015, 13 pgs.

*Primary Examiner* — Hoai V Pham
(74) *Attorney, Agent, or Firm* — Slater Matsil, LLP

(57) ABSTRACT

A structure of an under bump metallization and a method of forming the same are provided. The under bump metallization has a redistribution via hole, viewed from the top, in a round shape or a polygon shape having an angle between adjacent edges greater than 90°. Therefore, the step coverage of the later formed metal layer can be improved.

20 Claims, 5 Drawing Sheets

(51) Int. Cl.
*H01L 23/31* (2006.01)
*H01L 23/525* (2006.01)

(52) U.S. Cl.
CPC .......... *H01L 2224/0239* (2013.01); *H01L 2224/02311* (2013.01); *H01L 2224/02313* (2013.01); *H01L 2224/02315* (2013.01); *H01L 2224/02331* (2013.01); *H01L 2224/02372* (2013.01); *H01L 2224/02381* (2013.01); *H01L 2224/0361* (2013.01); *H01L 2224/0362* (2013.01); *H01L 2224/0391* (2013.01); *H01L 2224/0401* (2013.01); *H01L 2224/05008* (2013.01); *H01L 2224/05024* (2013.01); *H01L 2224/05147* (2013.01); *H01L 2224/05155* (2013.01); *H01L 2224/05166* (2013.01); *H01L 2224/05184* (2013.01); *H01L 2224/05569* (2013.01); *H01L 2224/05572* (2013.01); *H01L 2224/05647* (2013.01); *H01L 2924/30101* (2013.01); *H01L 2924/30105* (2013.01)

(56) References Cited

U.S. PATENT DOCUMENTS

| | | | |
|---|---|---|---|
| 2007/0241460 A1* | 10/2007 | Mis | H01L 23/53223 257/764 |
| 2010/0246152 A1* | 9/2010 | Lin | H01L 21/563 361/783 |
| 2011/0198753 A1 | 8/2011 | Holland | |
| 2013/0113097 A1 | 5/2013 | Yu et al. | |
| 2013/0127052 A1 | 5/2013 | Tu | |
| 2013/0187277 A1 | 7/2013 | Chen et al. | |
| 2013/0320522 A1 | 12/2013 | Lai | |
| 2014/0145326 A1 | 5/2014 | Lin et al. | |

FOREIGN PATENT DOCUMENTS

| | | |
|---|---|---|
| CN | 102800650 A | 11/2012 |
| JP | 2007500445 A | 1/2007 |
| KR | 20130086266 A1 | 8/2013 |
| KR | 20130134991 A | 12/2013 |
| TW | 201025530 | 7/2010 |

* cited by examiner

METHOD OF FORMING REDISTRIBUTION LAYER

RELATED APPLICATIONS

The present application is a Divisional application of the application Ser. No. 14/179,688, filed Feb. 13, 2014, all of which are herein incorporated by reference.

BACKGROUND

The most important trend in the semiconductor industry over the last several decades has been a continued striving to improve device performance, which also requires a continuous decrease of semiconductor device feature sizes. In present day semiconductor devices, it is common to encounter feature size in the deep sub-micron range. With this decrease in feature size, sub-micron metal interconnects become increasingly more important. Ideally, a metal layer should be evenly deposited and should fill the profile for the metal line with equal metal density. However, for the sizes of sub-micron metal interconnects, poor step coverage of the deposited metal layer is often encountered. Moreover, when the thickness of the sub-micron metal interconnects is increased to solve the RC delay problem, the poor step coverage problem will only become more serious.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
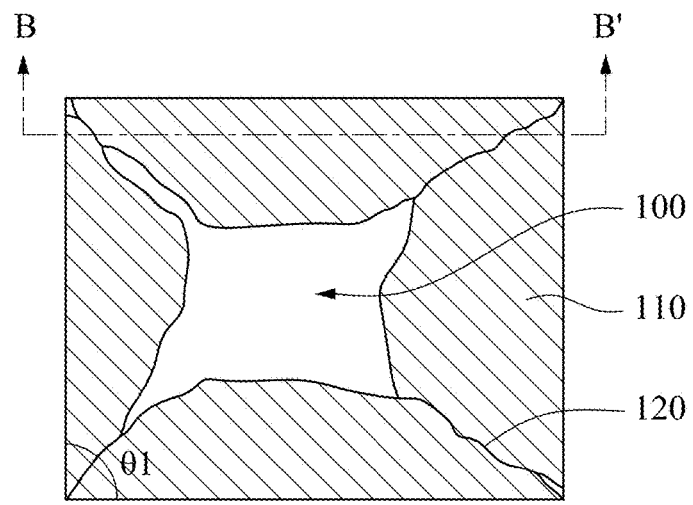
FIG. 1A is a top-viewed diagram of a metal layer deposited in a conventional redistribution via hole, which has been partially filled by the metal layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As stated above, since sub-micron metal interconnects become more and more important in the present day semiconductor device, the problem of RC delay may become more and more serious. Therefore, increasing the thickness of the sub-micron metal interconnects may be a solution to the increasingly serious RC delay problem. However, when the thickness of the sub-micron metal interconnects is increased to solve RC delay problem on the one hand, the poor step coverage problem of the deposited metal layer may become more serious on the other hand. The under bump metallization also encounter the dilemma problem above.

For the present flip chip technology, redistribution metal layers are used to relocate I/O bonding pads of an integrated circuit (IC) to have the advantages of lower cost, higher density, greater flexibility, and improved performance. However, limited by the design rule, the area occupied by the redistribution via holes in a passivation layer covering bonding pads and the spacing of the adjacent redistribution via holes cannot be increased anymore. Therefore, increasing the thickness of the redistribution metal line is the only choice for decreasing RC delay of the latter formed redistribution metal layer, and the aspect ratio of the redistribution via holes is thus increased.

However, when the ratio of the thickness of the redistribution metal line over the diameter of the redistribution via hole was increased to at least 1.4, pin hole failure was created by poor step coverage of the deposited metal layer. FIG. 1A is a top-viewed diagram of a metal layer deposited in a conventional redistribution via hole, which has been partially filled by the metal layer. According to the design rule, the conventional redistribution via hole 100 has a shape in square viewed from the top. After the redistribution via hole 100 is formed in a first passivation layer (not shown in FIG. 1A) covering a metal pad (not shown in FIG. 1A), a first metal layer 110 begins to be deposited in the redistribution via hole 100 and cover the first passivation layer.

In FIG. 1A, the redistribution via hole 100 is partially filled, and it can be seen that seams 120 are formed almost along the diagonal lines between adjacent edges of the redistribution via hole 100. This is because the centers of the edges of the redistribution via hole 100 have a faster metal deposition rate, and the corners of the redistribution via hole 100 have a slower metal deposition rate. In addition to the uneven metal deposition rates described above, the angles 61 between the adjacent edges of the redistribution via hole 100 are smaller or equal to 90°. The smaller angles between the adjacent edges of the redistribution via hole 100 make it more easily to generate seams 120 and produce overhangs (not shown in FIG. 1A) on the upper portion of the first metal layer 110 deposited in the redistribution via hole 100. These seams 120 and overhangs cause pin hole failure of the later-formed redistribution metal layer, since acid etching solutions used later for patterning the first metal layer 110 to form the redistribution metal layer, patterning a second passivation layer covering the redistribution metal layer, and patterning a second metal layer formed in a terminal via hole in the second passivation layer will flow into the inside of the first metal layer 110 through these seams 120 and corrode the first metal layer 110.

Moreover, during the deposition of the first metal layer 110 in the redistribution via hole 100, if the problem of forming overhangs at the upper portion of the first metal layer 110 deposited in the redistribution via hole 100 is serious, a void may even formed in the metal layer 110 located in the redistribution via hole 100. The void may accumulate the acid etching solution to make the corrosion problem more serious and greatly increase RC delay of the redistribution metal layer.

Figure 1B:
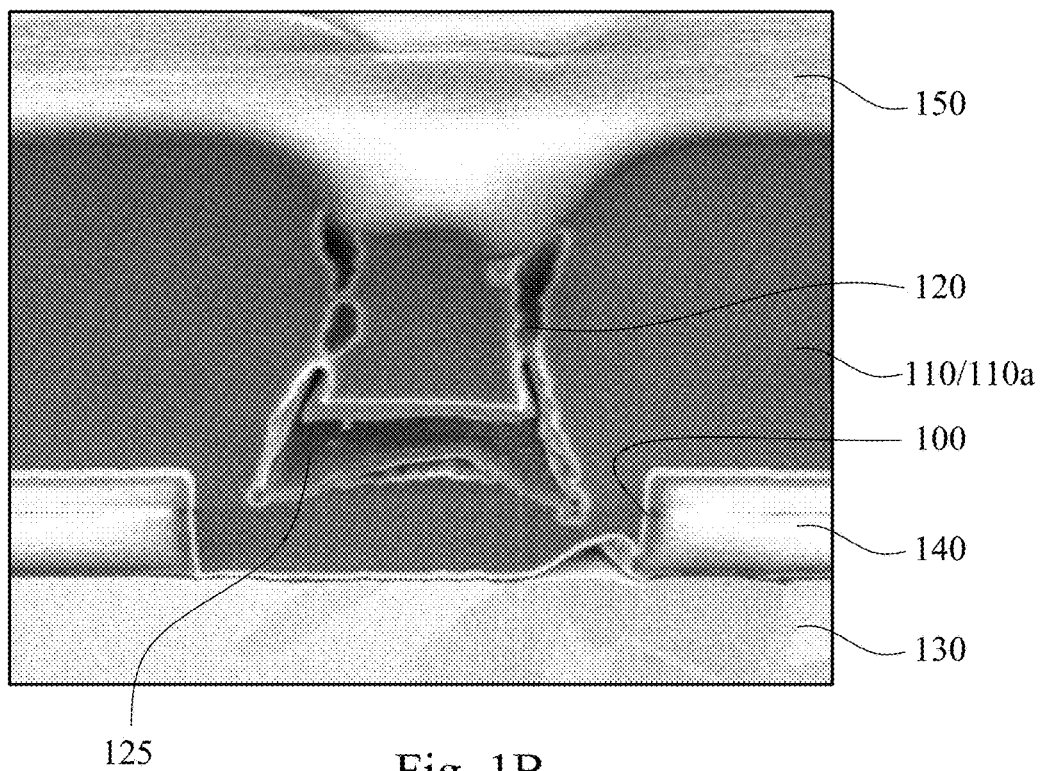
FIG. 1B is a scanning electron microscopic image showing a cross-sectional view after a metal layer deposited in a conventional redistribution via hole.

FIG. 1B is a scanning electron microscopic (SEM) image showing a cross-sectional view after a metal layer deposited in a conventional redistribution via hole. The cross-sectional SEM image shown in FIG. 1B is corresponding to the cross-section of cutting line BB' in FIG. 1A. In FIG. 1B, a first passivation layer 140 was deposited on a metal pad 130. A redistribution via hole 100 was then formed in the first passivation layer 140 to expose the metal pad 130. A first metal layer 110 was then deposited to fill the redistribution via hole 100 and cover the first passivation layer 140. After patterning the first metal layer 110 to form a redistribution metal layer 110a, a second passivation layer 150 was subsequently deposited on the redistribution metal layer 110a. In the SEM image shown in FIG. 1B, it can be clearly seen that a serious U-shape corrosion region 125 was formed along the seams 120. Consequently, the yield of the IC chips was seriously decreased.

In light of the foregoing, how to solve the RC delay problem and the pin hole failure at the same time become a thorny issue. However, it was finally found that if the angles θ1 between adjacent edges of the redistribution via hole 100 was increased, the problem of the pin hole failure can be solved and the small RC delay can be maintained at the same time.

Figure 2A:
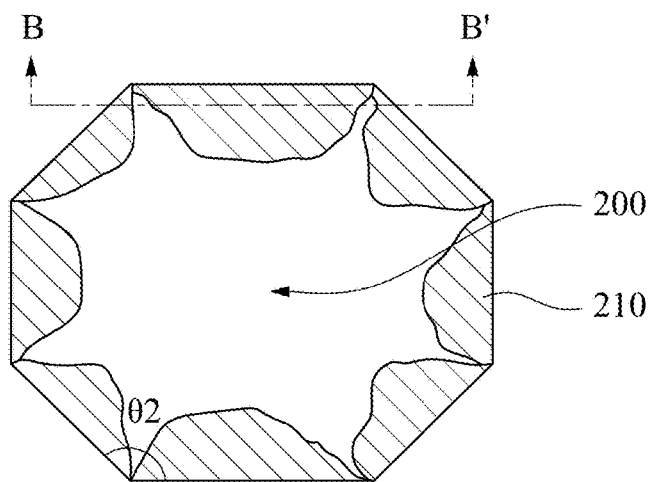
FIG. 2A is a top-viewed diagram of a metal layer deposited in a redistribution via hole, which has been partially filled by the metal layer, according to some embodiments of this disclosure.

FIG. 2A is a top-viewed diagram of a metal layer deposited in a redistribution via hole, which has been partially filled by the metal layer, according to some embodiments of this disclosure. In FIG. 2A, a first metal layer 210 is deposited in a redistribution via hole 200 formed in a first passivation layer (not shown in FIG. 2A) covering a metal pad. The redistribution via hole 200 is partially filled by the first metal layer 210. The redistribution via hole 200 in FIG. 2A has a shape in octagon viewed from the top. Therefore, the angles θ2 (135°) between adjacent edges of the redistribution via hole 200 having a octagonal shape is larger than the angles θ1 (90°) between adjacent edges of the redistribution via hole 100 having a square shape in FIG. 1A. It can be seen that no seams are formed between adjacent edges of the redistribution via hole 200.

Figure 2B:
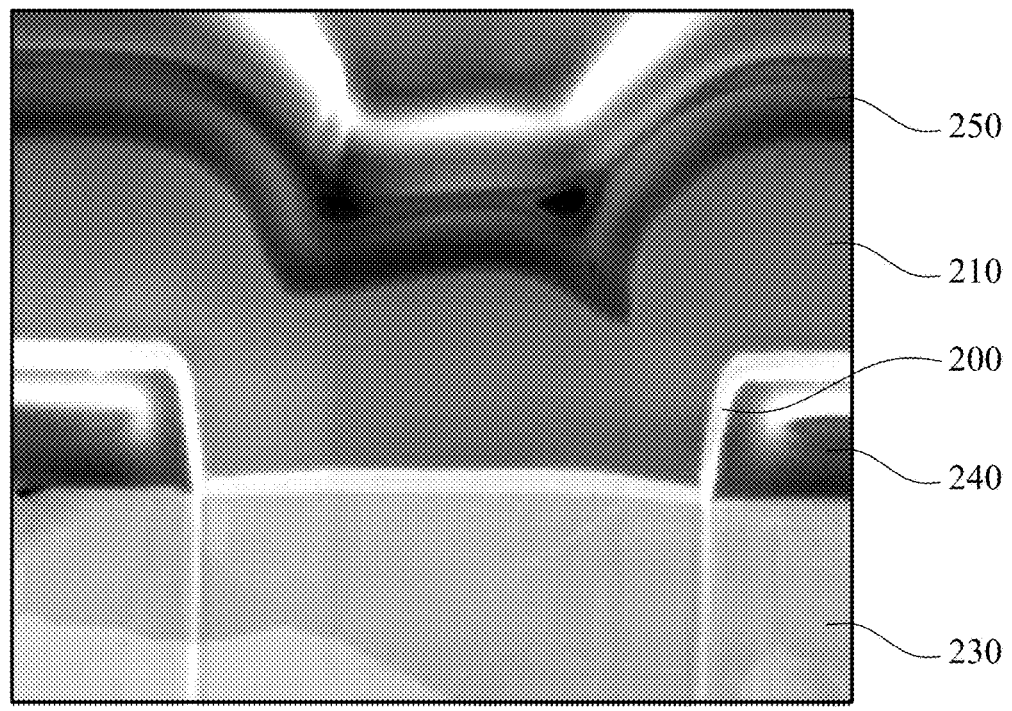
FIG. 2B is a scanning electron microscopic (SEM) image showing a cross-sectional view after a metal layer deposited in a redistribution via hole having an octagonal shape viewed from the top, according to some embodiments of this disclosure.

FIG. 2B is a scanning electron microscopic (SEM) image showing a cross-sectional view after a metal layer deposited in a redistribution via hole having an octagonal shape viewed from the top. The cross-sectional SEM image shown in FIG. 2B is corresponding to the cross-section of cutting line BB' in FIG. 2A. In FIG. 2B, a redistribution via hole 200 was formed in a first passivation layer 240 covering a metal pad 230. A first metal layer 210 filled the redistribution via hole 200, and a second passivation layer 250 covered the first metal layer 210. It can be seen that no seams were formed in FIG. 2B, and thus no corrosion regions can be observed in FIG. 2B.

In light of the foregoing, it may be understand that when a metal layer deposited in a via hole, the metal deposition rate at the corners of the via hole may be increased as the angles θ between adjacent edges of the via hole is increased, since the corners of the via hole has a more open space. Therefore, the difference between the metal deposition rates at the edge centers of the via hole and the corners of the via hole may be decreased to have more evenly metal deposition rates, and the problem of overhangs may also be mitigated as well. The more evenly metal deposition rates can avoid forming seams between adjacent edges of the via hole and avoid forming overhangs, and thus can avoid pin hole failure of the metal plug formed later in the via hole. Therefore, increasing the angles θ between adjacent edges of the via hole is an effective way to solve the problem of pin hole failure.

According to some embodiments, the angles θ between adjacent edges of a via hole is more than 90° to solve the problem of pin hole failure. According to some other embodiments, the angles θ between adjacent edges of a via hole is at least 108° to solve the problem of pin hole failure. According to some other embodiments, the angles θ between adjacent edges of a via hole is at least 135° to solve the problem of pin hole failure. Or in some embodiments, a via hole may be in a round shape to have the evenly metal deposition rate at every sites of the via hole.

Figure 3:
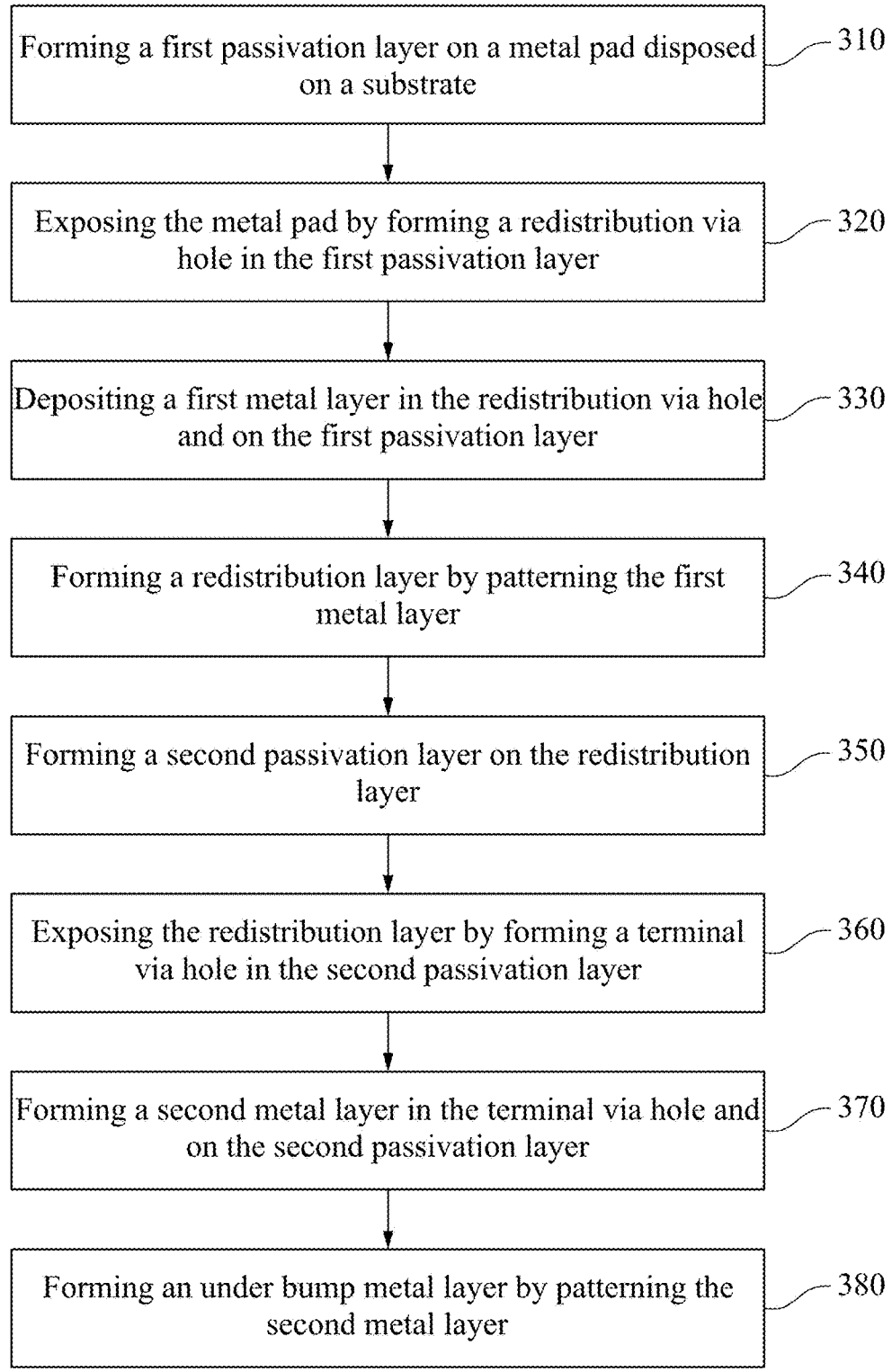
FIG. 3 is a flow chart of forming an under bump metallization structure according to some embodiments of this disclosure.

According to some embodiments, a method of forming an under bump metallization structure is provided below. FIG. 3 is a flow chart of forming an under bump metallization structure according to some embodiments of this disclosure. FIGS. 4A-4D are cross-sectional diagrams showing a process of forming an under bump metallization structure according to some embodiments of this disclosure. FIG. 3 and FIGS. 4A-4D are referred below at the same time.

Figure 4A:
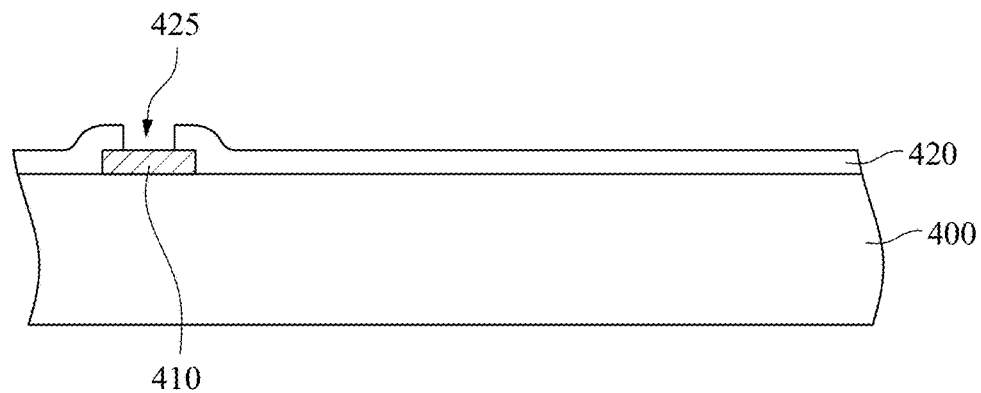
FIGS. 4A-4D are cross-sectional diagrams showing a process of forming an under bump metallization structure according to some embodiments of this disclosure.

In step 310 of FIG. 3 and FIG. 4A, a first passivation layer 420 is formed on a metal pad 410 on a substrate 400. The substrate 400 has some semiconductor devices (not shown in FIG. 4A) and some metal interconnect structure (not shown in FIG. 4A) already formed thereon. The metal pad 410 may be made from a metal, such as Al or Cu, or a metal alloy, such as AlCu or AlCuSi. The formation method of the metal pad may be performed by a deposition process followed by a patterning process. The deposition process above may be chemical vapor deposition, physical vapor deposition or plating. The patterning process above may be a combination of photolithography and etching.

The first passivation layer 420 may be made from silicon nitride, undoped silicate glass, polyimide, or any combinations thereof. For example, the first passivation layer 420 may be a silicon nitride layer, according to some embodiments. The first passivation layer 420 may also be composed of a lower silicon nitride layer and an upper polyimide layer, according to some other embodiments. The formation method of the first passivation layer 420 may be performed by chemical vapor deposition, spin coating, or a combination thereof.

In step 320 of FIG. 3 and in FIG. 4A, the metal pad 410 is exposed by forming a redistribution via hole 425 in the first passivation layer 420. The formation method of the redistribution via hole 425 may be performed by a photolithography process followed by an etching process. Viewed from the top, the redistribution via hole 425 has a round shape or a polygon shape having angles between adjacent edges greater than 90°, such as at least 108° or at least 135°. According to some embodiments, the diameter or the width of the redistribution via hole 425 is from about 1 μm to about 4 μm.

Figure 4B:
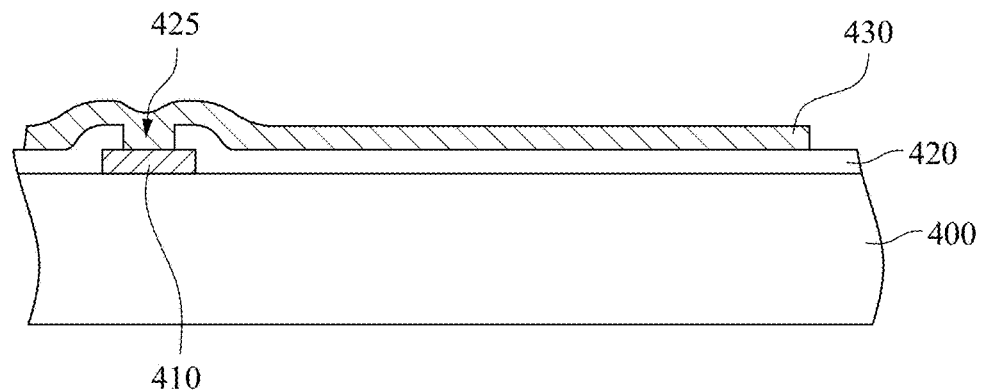

In step 330 of FIG. 3 and in FIG. 4B, a first metal layer is then deposited in the redistribution via hole 425 and on the first passivation layer 420. The first metal layer may be made from a composite metal layer to meet the needs of adhesion, barrier, conductor, and protection. According to some embodiments, the first metal layer may be made from a bottom metal layer and a top metal layer. The bottom metal layer may be Al, Ni, V, Cu, Ti, or NiV, and the top metal layer may be Ni, V, Cu, NiV, Cr, or W, for example. The deposition method of the first metal layer may be physical vapor deposition, chemical vapor deposition, or plating.

According to some other embodiments, when a ratio of a thickness of the first metal layer over the diameter (or the width) of the redistribution via hole 425 is at least about 1.4, such as from about 1.4 to about 2.5, the angle between adjacent edges of the redistribution via hole 425 has better to be greater than 90°, such as at least 108° or at least 135°, to avoid forming seams and overhangs. For example, when the diameter or the width of the redistribution via hole 425 is about 2 μm, as long as the thickness of the first metal layer is more than or equal to 2.8 μm, seams and overhangs will be generated and pin hole failure is thus produced.

Subsequently in step 340 and FIG. 4B, the metal layer is then patterned to form a conductive redistribution layer 430. The patterning method may be performed by a combination of photolithography and etching. The etching solution used by the etching process may contain an acid, which may cause pin hole failure in the conductive redistribution layer 430 located in the redistribution via hole 425 if seams are formed therein.

Figure 4C:
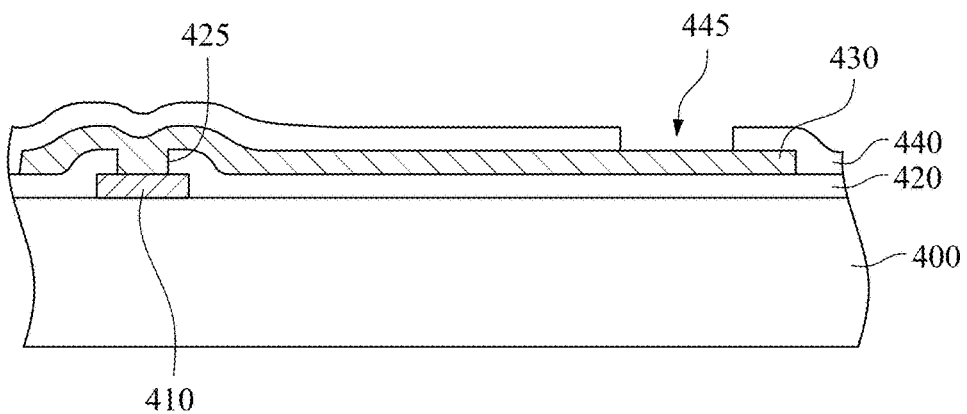

In step 350 of FIG. 3 and in FIG. 4C, a second passivation layer 440 is formed on the conductive redistribution layer 430 and the first passivation layer 420. The second passivation layer 440 may be made from silicon nitride, polyimide, or a combination thereof, for example. The formation method of the second passivation layer 440 may be performed by chemical vapor deposition, spin coating, or a combination thereof.

In step 360 of FIG. 3 and in FIG. 4C, a portion of the conductive redistribution layer 430 is exposed by forming a terminal via hole 445 in the second passivation layer 440. The formation method of the terminal via hole 445 may be performed by a combination of a photolithography process followed by an etching process. The etching process may use an etching solution containing another acid. Similarly, the acid may cause pin hole failure in the conductive redistribution layer 430 located in the redistribution via hole 425 if seams are formed therein.

Figure 4D:
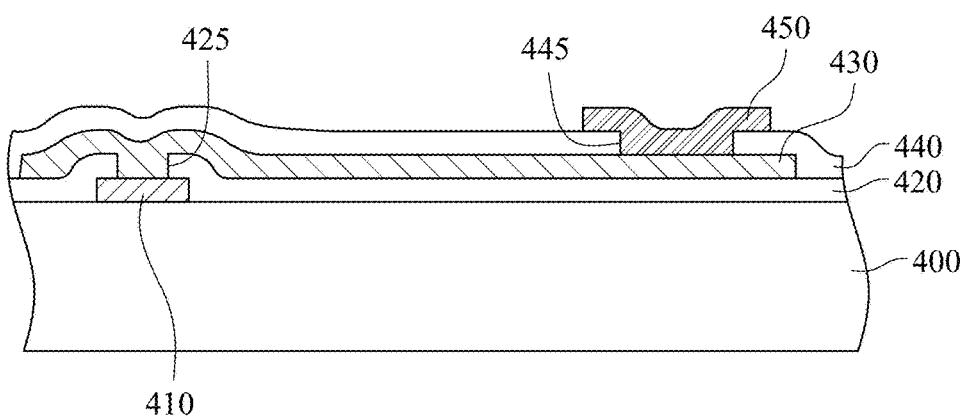

In step 370 of FIG. 3 and in FIG. 4D, a second metal layer is formed in the terminal via hole 445 and on the second passivation layer 440. The second metal layer may be made from a composite metal layer. According to some embodiments, the second metal layer may comprise a bottom adhesion layer, a diffusion barrier layer, a solder-wettable layer, and an optional oxidation barrier layer. According to some other embodiments, the second metal layer may be a composite metal layer of Cr/CrCu/Cu, Ti/NiV, Ti/Cu, Ti/W/Au, or Ni/Au.

In step 380 of FIG. 3 and in FIG. 4D, an under bump metal layer 450 is formed by patterning the second metal layer. The patterning method of the second metal layer may be performed by a combination of photolithography and etching process. The etching solution used by the etching process may contain an acid, which may cause pin hole failure in the conductive redistribution layer 430 located in the redistribution via hole 425 if seams are formed therein.

Accordingly, although limited by the design rule, the area occupied by each redistribution via holes and the spacing between adjacent redistribution via holes cannot be increased anymore. RC delay problem and pin hole failure still can be resolved by increasing the height of the redistribution layer and changing the shape of the redistribution via holes from square to round or polygon having angles between adjacent edges of the redistribution via holes more than 90°.

According to some embodiments, a structure of a redistribution metallization is provided. The redistribution metallization structure comprises an insulating passivation layer having a redistribution via hole as well as a conductive redistribution layer filling the redistribution via hole and disposed on the passivation layer. The redistribution via hole exposes a metal pad disposed on a substrate and has a round shape or a polygon shape viewed from top, and the polygon shape has an angle between adjacent edges greater than 90°.

According to some other embodiments, a structure of an under bump metallization is provided. The under bump metallization structure comprises a metal pad on a substrate, a first passivation layer disposed on the metal pad and having a redistribution via hole exposing the metal pad, having a redistribution via hole exposing the metal pad, a redistribution layer disposed in the redistribution via hole and on the first passivation layer, a second passivation layer disposed on the redistribution layer and having a terminal via hole exposing a part of the redistribution layer, and an under bump metal layer disposed in the terminal via hole and on the second passivation layer. The redistribution via hole above has a round shape or a polygon shape having an angle between adjacent edges greater than 90°, viewed from top.

According to some other embodiments, a method of forming an under bump metallization structure is provided. The method comprises the following operations. A first passivation layer is formed on a metal pad disposed on a substrate. The metal pad is exposed by forming a redistribution via hole in the first passivation layer, and the redistribution via hole has a round shape or a polygon shape having an angle between adjacent edges greater than 90°. A first metal layer is formed in the redistribution via hole and on the first passivation layer. A redistribution layer is formed by patterning the first metal layer. A second passivation layer is formed on the redistribution layer. A portion of the redistribution layer is exposed by forming a terminal via hole in the second passivation layer. A second metal layer is formed in the terminal via hole and on the second passivation layer. An under bump metal layer is formed by patterning the second metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a redistribution layer, the method comprising:
   forming a first passivation layer on a metal pad disposed on a substrate;
   exposing the metal pad by forming a redistribution via hole in the first passivation layer, wherein the redistribution via hole has a polygon shape having an angle between adjacent edges greater than 90°, in a top view;
   depositing a first metal layer in the redistribution via hole and on the first passivation layer; and
   forming a redistribution layer by patterning the first metal layer, wherein a ratio of a thickness of the redistribution layer over the diameter of the redistribution via hole is about 1.4 to about 2.5.

2. The method of claim 1, wherein the first passivation layer is made from silicon nitride, undoped silicate glass, polyimide, or any combinations thereof.

3. The method of claim 1, wherein the redistribution layer comprises a composite metal layer.

4. The method of claim 1, wherein the angle between adjacent edges of the polygon shape is at least 108°.

5. The method of claim 1, wherein the angle between adjacent edges of the polygon shape is at least 135°.

6. The method of claim 1, wherein forming the first passivation layer is performed by chemical vapor deposition, spin coating, or a combination thereof.

7. The method of claim 1, wherein forming the redistribution via hole is performed by a photolithography process followed by an etching process.

8. The method of claim 1, wherein depositing the first metal layer is performed by physical vapor deposition, chemical vapor deposition, or plating.

9. The method of claim 1, further comprising forming an under bump metal layer over the redistribution layer.

10. The method of claim 9, further comprising forming a second passivation layer between the redistribution layer and the under bump metal layer.

11. The method of claim 10, wherein the second passivation layer has a terminal via exposing the redistribution layer and a portion of the under bump metal layer is disposed in the terminal via.

12. A method of forming a redistribution layer, the method comprising:
   forming a first passivation layer on a metal pad disposed on a substrate;
   exposing the metal pad by forming a redistribution via hole in the first passivation layer;
   depositing a first metal layer in the redistribution via hole and on the first passivation layer, wherein the lowest portion of a top surface of the first metal layer is in a position higher than a top surface of the first passivation layer, and a portion of the first metal layer is in contact with the top surface of the first passivation layer; and
   forming a redistribution layer by patterning the first metal layer, wherein a ratio of a thickness of the redistribution layer over a diameter of the redistribution via hole is at least 1.4.

13. The method of claim 12, wherein the redistribution via hole has a polygon shape, an angle between adjacent edges of the polygon shape being at least 108°.

14. The method of claim 12, further comprising forming an under bump metal layer over the redistribution layer.

15. The method of claim 14, further comprising forming a second passivation layer between the redistribution layer and the under bump metal layer.

16. The method of claim 15, wherein the second passivation layer has a terminal via exposing the redistribution layer and a portion of the under bump metal layer is disposed in the terminal via.

17. A method of forming a redistribution layer, the method comprising:
   forming a first passivation layer on a metal pad disposed on a substrate;
   exposing the metal pad by forming a redistribution via hole in the first passivation layer;
   depositing a first metal layer in the redistribution via hole and on the first passivation layer; and
   forming a redistribution layer by patterning the first metal layer, wherein a ratio of a thickness of the redistribution layer over the diameter of the redistribution via hole is about 1.4 to about 2.5, and no seams and overhangs are formed at the redistribution layer in the redistribution via hole.

18. The method of claim 17, further comprising forming an under bump metal layer over the redistribution layer.

19. The method of claim 18, further comprising forming a second passivation layer between the redistribution layer and the under bump metal layer.

20. The method of claim 19, wherein the second passivation layer has a terminal via exposing the redistribution layer and a portion of the under bump metal layer is disposed in the terminal via.

* * * * *